United States Patent [19]
Lee

[11] Patent Number: 5,972,540
[45] Date of Patent: Oct. 26, 1999

[54] PHASE-SHIFTING MASK AND A MANUFACTURING METHOD THEREOF

[75] Inventor: Jun Seok Lee, Seoul, Rep. of Korea

[73] Assignee: LG Semicon Co., Ltd., Chungcheongbuk-do, Rep. of Korea

[21] Appl. No.: 08/966,701

[22] Filed: Nov. 10, 1997

Related U.S. Application Data

[63] Continuation of application No. 08/718,678, Sep. 24, 1996, abandoned.

[30] Foreign Application Priority Data

Sep. 25, 1995 [KR] Rep. of Korea .................... 95/31656

[51] Int. Cl.⁶ ...................................................... G03F 9/00
[52] U.S. Cl. ................................................ 430/5; 430/325
[58] Field of Search ............................... 430/5, 322, 324, 430/325, 328, 330

[56] References Cited

U.S. PATENT DOCUMENTS

| | | |
|---|---|---|
| 5,254,418 | 10/1993 | Kamon et al. ................ 430/5 |
| 5,268,244 | 12/1993 | Yoo ............................... 430/5 |
| 5,281,500 | 1/1994 | Cathey et al. ................ 430/5 |
| 5,288,568 | 2/1994 | Cathey et al. ................ 430/5 |
| 5,300,377 | 4/1994 | Keum .......................... 430/5 |
| 5,322,748 | 6/1994 | Watakabe et al. ........... 430/5 |
| 5,532,089 | 7/1996 | Adair et al. .................. 430/5 |

*Primary Examiner*—S. Rosasco
*Attorney, Agent, or Firm*—Finnegan, Henderson, Farabow, Garrett & Dunner, L.L.P.

[57] ABSTRACT

A phase-shifting mask has a phase shifter formed by thermal deformation of an organic photoresist followed by a CMP (Chemical Mechanical Polishing) process to prevent occurrence of pattern errors at an 180°/0° phase boundary. A related method is also disclosed, including the steps of: providing a substrate; forming a conductive transparent layer on the substrate; forming light shielding layers at predetermined intervals on the conductive transparent layer; and forming phase shifters having planar top and rounded sides in phase-shifting regions between the light shielding layers.

37 Claims, 11 Drawing Sheets

PHASE-SHIFTING MASK AND A MANUFACTURING METHOD THEREOF

This application is a continuation of application Ser. No. 08/718,678, filed Sep. 24, 1996, now abandoned.

BACKGROUND OF THE INVENTION

1. Field of the Invention

The present invention relates to a phase-shifting mask, and more particularly to a phase-shifting mask which has a phase shifter formed by thermal deformation of an organic photoresist followed by CMP (Chemical Mechanical Polishing) to prevent pattern errors at an 180°/0° phase boundary.

2. Description of the Prior Art

In general, the photolithography process used in manufacturing semiconductors uses a mask which consists of a patterned opaque layer provided on a transparent substrate. Phase shift masks have recently been introduced in order to improve optical resolving power and correct degraded resolution due to optical interference at the edges of the opaque layer. In particular, a phase shifter is provided at the edge of the opaque layer to shift the phase of incident light to achieve these improvements. Generally, a phase difference of 180° between the phase shifter and the transparent substrate is preferred and is obtained when the thickness of the phase shifter satisfies the following formula:

$$d = \frac{\lambda}{2(n - n_0)} \quad (1)$$

where, n is a refractive index of the phase shifter, $\lambda$ is a wavelength of light from a light source, and $n_0$ is an ambient refractive index. Typically $n_o$ is the refractive index of air, which is unity.

Figure 1:
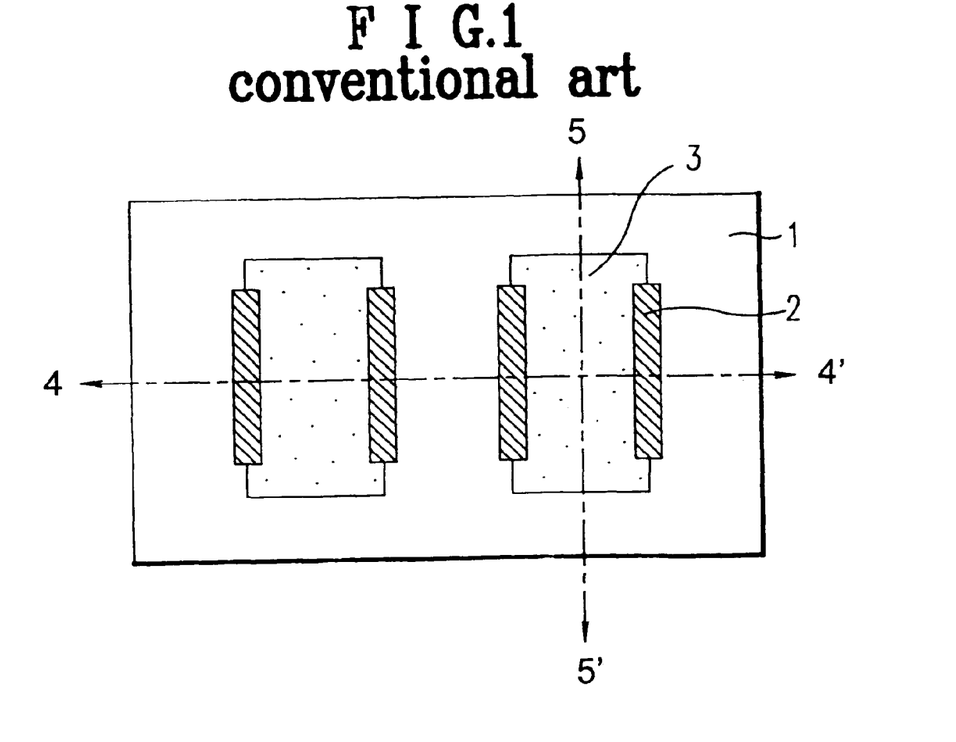
FIG. 1 illustrates a plan view of a conventional phase-shifting mask.
Figure 2:
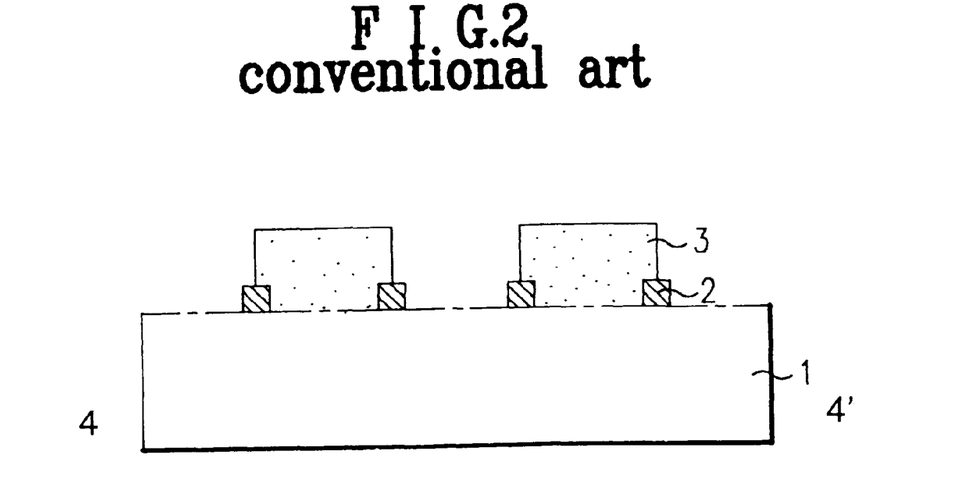
FIG. 2 illustrates a cross-sectional view of a conventional phase-shifting mask taken along line 4—4' in FIG. 1.
Figure 3:
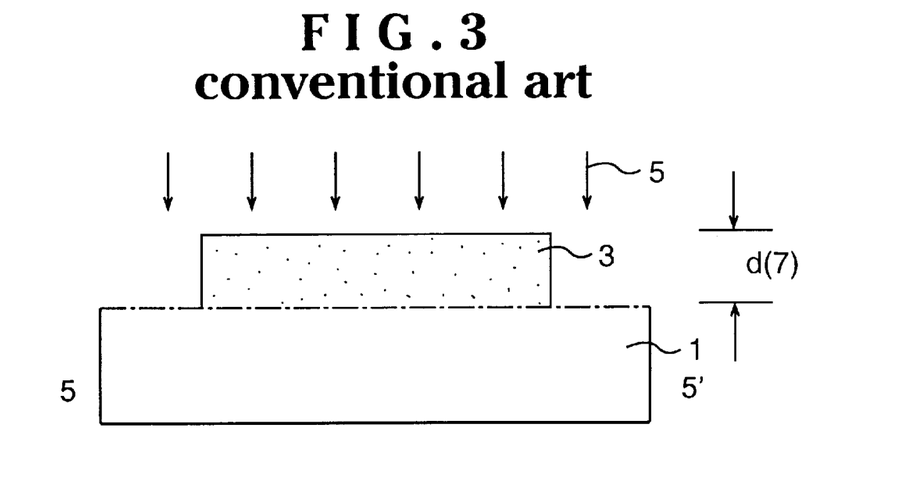
FIG. 3 illustrates a cross-sectional view of a conventional phase shifting mask taken along line 5—5' in FIG. 1.

FIG. 1 illustrates a plan view of a conventional phase-shifting mask, FIG. 2 illustrates a sectional view of the phase-shifting mask in FIG. 1 along section line 4—4', and FIG. 3 illustrates a sectional view of the phase-shifting mask in FIG. 1 length-wise along section line 5—5'.

As shown in FIGS. 1–3, the conventional alternating phase-shifting mask includes a plurality of light shielding layers 2 and phase shifters 3 formed on the transparent substrate 1 between the light-shielding layers 2. It should be noted that phase shifters 3 are not formed between each adjacent pair of light shielding layers 2, but between alternate pairs of light shield layers 2. Further, the light shielding layers 2 are not provided along the entire periphery of the phase shifter 3, but only adjacent portions of light shielding layers 2.

That is, as shown in FIG. 2, in some cases, the peripheries of the phase shifters 3 are part of the light shielding layers 2. In this case, the edges of the phase shifters 3 do not directly contact transparent substrate 1. Therefore, as shown in FIG. 2, the phase-shifting mask does not affect the intensity of light transmitted through the mask.

However, the desired circuit pattern frequently requires the peripheries of the phase shifters 3 to contact transparent substrate 1 directly (see FIG. 3). On the other hand, in order to obtain an optimal phase-shifting effect, thicknesses of the phase shifters 3 should be uniform and satisfy equation (1) above. Accordingly, at the peripheries of phase shifters 3, where no light shielding layers 2 have been formed and phase shifter 3 directly contacts substrate 1, the amplitude of incident light is abruptly changed from positive to negative, or vice versa, and the phase is also inverted.

Figure 4:
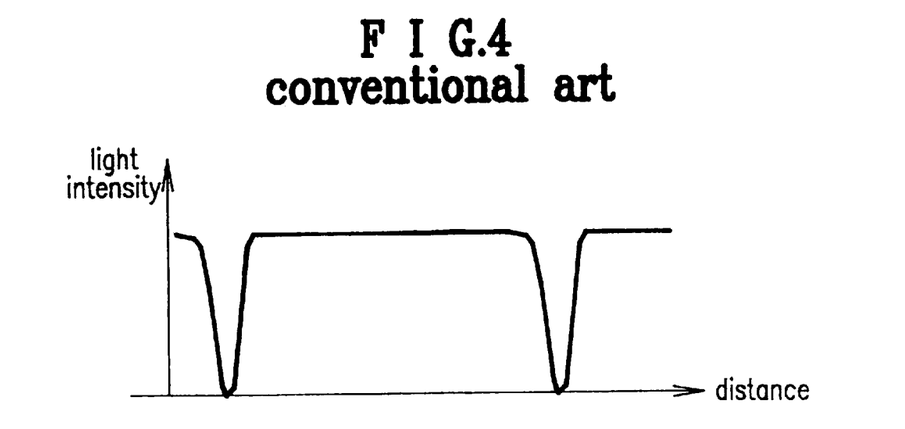
FIG. 4 illustrates a plot of light intensity vs. distance for the phase-shift mask shown in FIG. 1.
Figure 5:
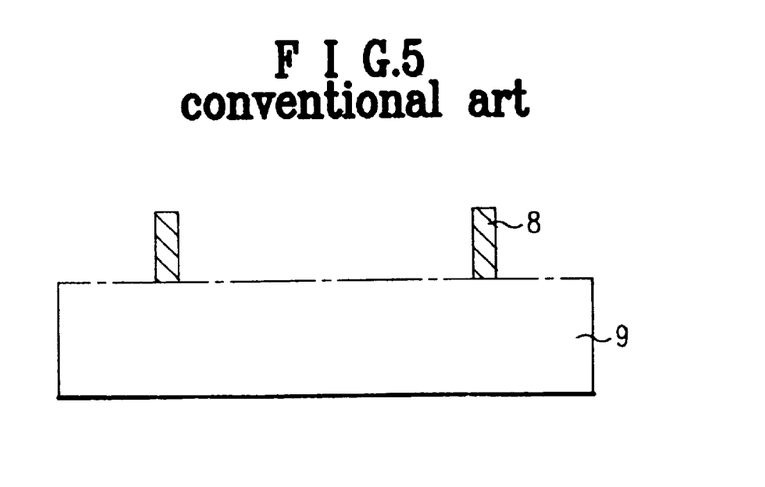
FIG. 5 illustrates a photoresist pattern due to exposure of light having an intensity pattern shown in FIG. 4.

Therefore, as shown in FIG. 4, the light intensity at a semiconductor substrate (reference number "9" in FIG. 5) drops to near zero at the boundary of the phase shifter 3. As a result, the edge portion behaves like an opaque region so that, after exposure, regions 8 of positive photoresist remain on semiconductor substrate 9 as residual patterns.

To cope with aforementioned problems in the conventional phase-shifting mask, different techniques have been developed.

Figure 6A:
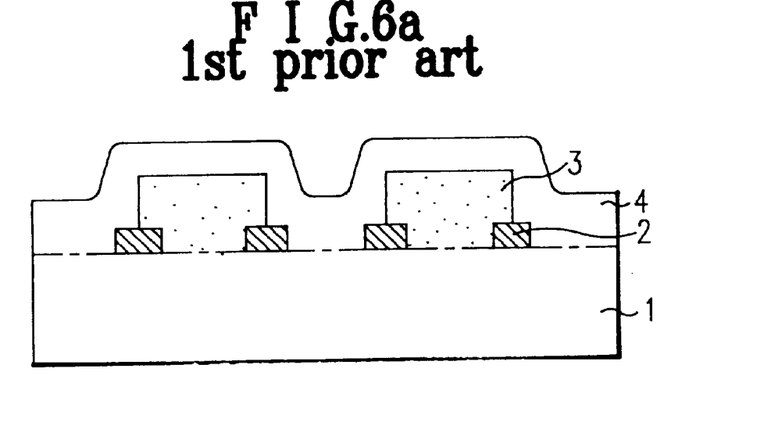
FIGS. 6a–6c illustrate sectional views showing a method for forming an alternative conventional phase-shifting mask.
Figure 6B:
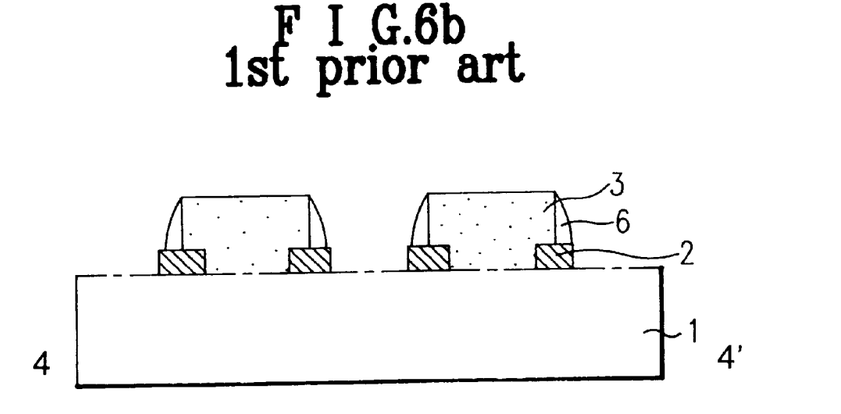
Figure 6C:
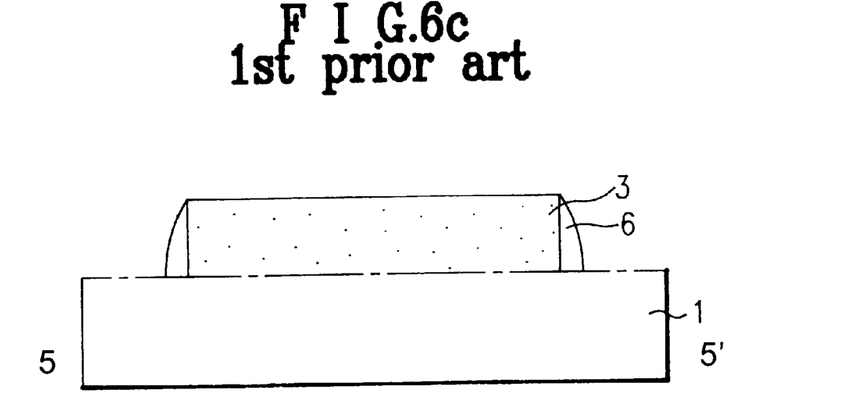

FIGS. 6a–6c show sectional views for manufacturing a conventional phase-shifting mask incorporating one such technique in which the edges of the particular phase shift mask have sloped sides which prevent abrupt phase shifting. A method for forming this particular conventional phase-shifting mask will now be explained.

As shown in FIG. 6a, light shielding layers 2 and first phase shifters 3 are formed on a transparent substrate 1 using the same process explained in association with FIGS. 1 and 3. A second phase shifter material 4 is then formed on the entire substrate surface by thermal oxidation.

As shown in transverse and lengthwise views of FIGS. 6b and 6c, respectively, the second phase shifter material 4 is dry etched to form second phase shifters 6 as sidewall spacers located on the sides of first phase shifters 3. As a result, abrupt amplitude changes at the edges of the phase shifter can be prevented. Consequently, residual photoresist patterns shown in FIG. 4 are not formed.

However, light shielding layers 2 are susceptible to deformation during high temperature process steps. Further, in case the first and second phase shifters are formed of the same material, it is difficult to identify the etch end point. Therefore, it can be difficult to precisely control the thickness of the phase shifter.

Figure 7A:
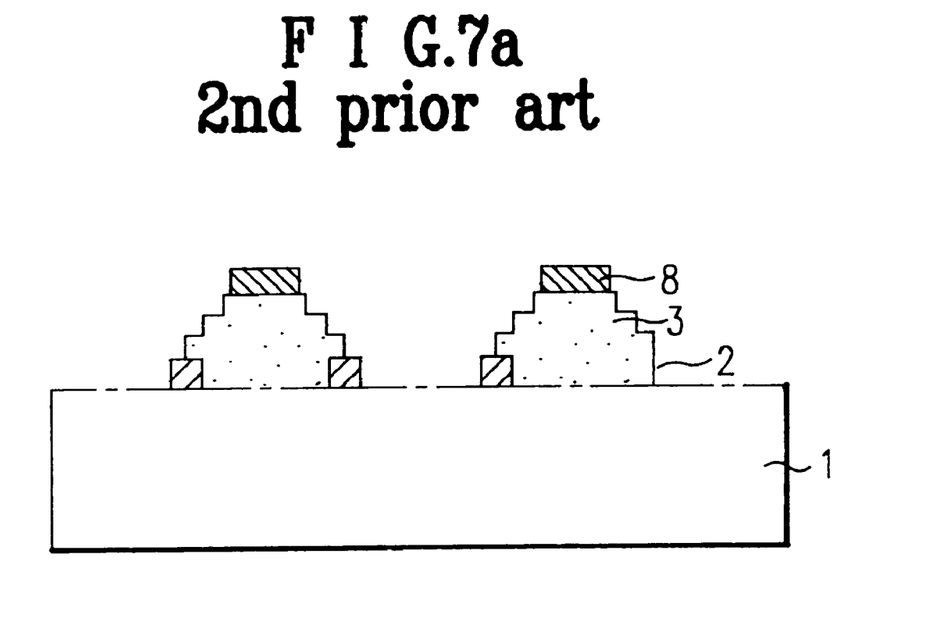
FIGS. 7a and 7b illustrate sectional views showing a method for forming yet another conventional phase-shifting mask.
Figure 7B:
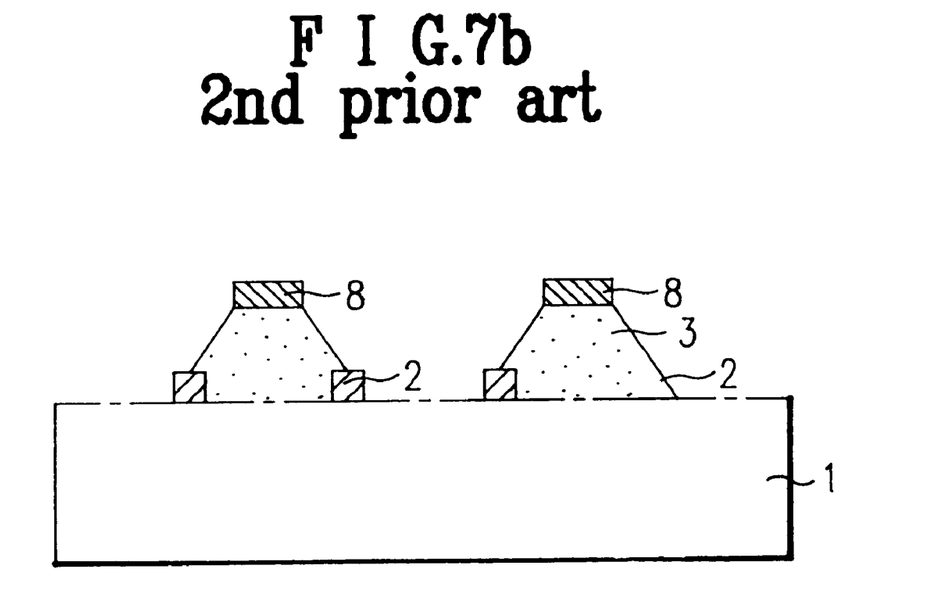

An alternative example for forming a conventional phase-shift mask is shown in FIGS. 7a and 7b. In this case, light shielding layers 2 and first phase shifters 3 are first formed according to the same method explained above with reference to FIGS. 1–3. Next, as shown in FIG. 7a, phase shifters 3 are etched by successive photo masking steps to form stepped portions of varying sizes.

As shown in FIG. 7b, the structure shown in FIG. 7a is subjected to a heat treatment to reflow the stepped portion to form phase shifter 3 with sloped side surfaces.

However, the above desired conventional phase-shifting masks have the following problems. First, the light shielding layers are susceptible to deformation during the heat treatment step. Moreover, etch end point detection is difficult when the first and second shifters are formed of the same material. As a result, the mask substrate can be damaged.

Second, phase shifters made of a dielectric material can be charged up during electron beam direct writing of the phase shifter material.

Third, a uniform phase-shifting effect of the phase shifter is difficult to obtain because light shielding layers underlie the phase shifters.

Fourth, the process used to fabricate the conventional phase-shifting mask is complicated.

SUMMARY OF THE INVENTION

The present invention is devised to solve the above-described problems. Accordingly, it is an object of the present invention to provide a mask and manufacturing method thereof, in which a phase shifter is formed using thermal deformation of an organic photoresist and chemical mechanical polishing (CMP) to prevent pattern errors at an 180°/0° phase boundary.

In one aspect of the present invention, to achieve the above object, there is provided a phase-shifting mask including a transparent substrate, a conductive transparent layer formed on the transparent substrate, a plurality of light shielding layers formed at specified intervals on the transparent layer. In addition, a hemispherical phase shifter is formed between pairs of light shielding layers. The hemispherical phase shifter is further formed to have a planar top surface and round side surfaces.

In accordance with another aspect of the present invention, a method is provided for forming a phase-shifting mask including the steps of providing a substrate, forming a conductive transparent layer on the substrate, forming light shielding layers at specified intervals on the conductive transparent layer, and forming phase shifters having a planar top surface and rounded side surface in phase-shifting regions between the light shielding layers.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENTS

A phase-shifting mask and a method for forming the phase-shifting mask in accordance with the present invention will now be explained in detail with reference to the attached drawings.

FIGS. 8a–8h illustrate sectional views showing a method for forming a phase-shifting mask in accordance with a first embodiment of the present invention.

Figure 8A:
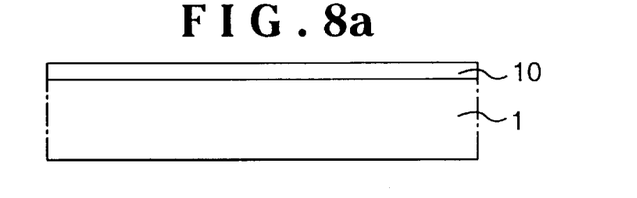
FIGS. 8a–8h illustrate sectional views showing a method for forming a phase-shifting mask in accordance with a first embodiment of the present invention.
Figure 8B:
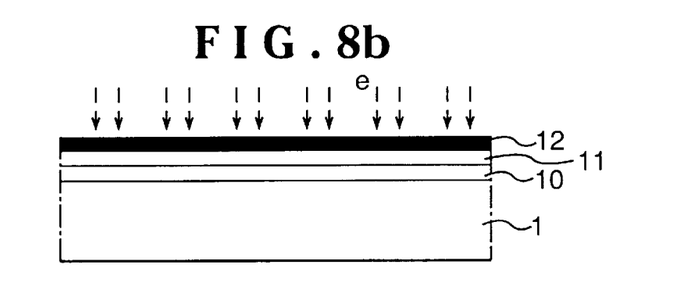

As shown in FIG. 8a, a conductive transparent layer 10 of $SnO_2$ is R.F. (radio frequency) sputtered on a transparent substrate 1. Next, as shown in FIG. 8b, an inorganic photoresist layer 11 of germanium selenide $Ge_{10}Se_{90}$ is deposited on the conductive transparent layer 10 by plasma enhanced chemical vapor deposition sputtering. Substrate 1 is then immersed in a silver solution, preferably $AgNO_3$, to plate inorganic photoresist 11 with a silver-containing layer 12.

Figure 8C:
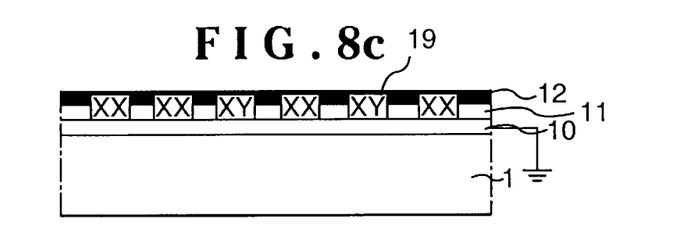

Then, as shown in FIG. 8c, the conductive transparent layer 10 is grounded, and an electron beam is selectively directed onto the light shielding regions to cause the exposed silver to diffuse into the first inorganic photoresist 11, thereby forming silver doped inorganic photoresist 19.

During the electron beam exposure, current generated by the electron beam is drained to ground through the conductive transparent layer 10.

Figures 8D, 8E:
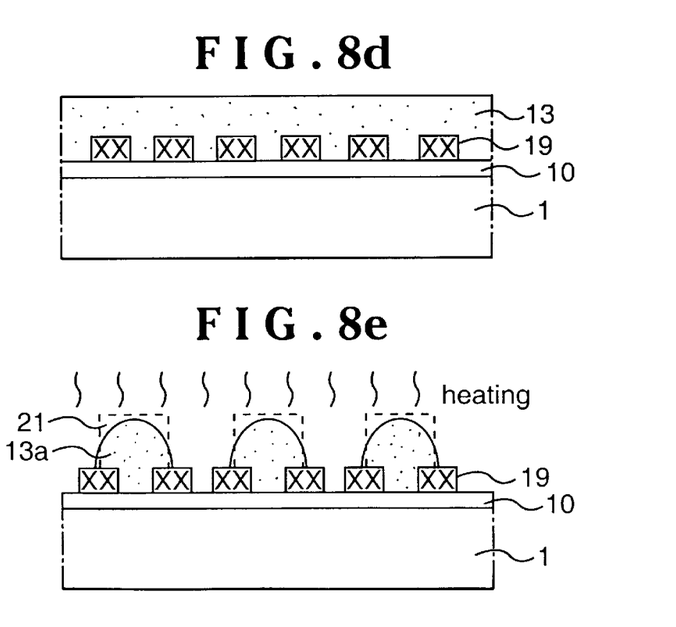

As shown in FIG. 8d, the silver-containing layer 12, which was not exposed by the electron beam, and the first inorganic photoresist 11 layer, which was not doped with silver, are removed with aqua regia, $HNO_3$—$HCl$—$H_2O$, and an alkaline developer, respectively.

A photoresist 13 suitable for electron beam lithography (preferably an organic photoresist such as poly methyl metha acrylate, PMMA) is deposited on the silver doped inorganic photoresist 19 and the conductive transparent layer 10. Phase-shifting regions are then defined thereon by a selectively directed electron beam.

As shown in FIG. 8e, electron beam resist layer 13 is developed to remove an unexposed portion thereof, thereby forming rectangular phase shifters 13a between the silver doped inorganic photoresist portions 19. The rectangular phase shifters 13 are then melted during a heat treatment step to form semispherical phase shifters 21. As a result, a sidewall of the semispherical phase shifter forms an angle with the surface of the substrate which is in the range of 30° to 80°.

Figure 8F:
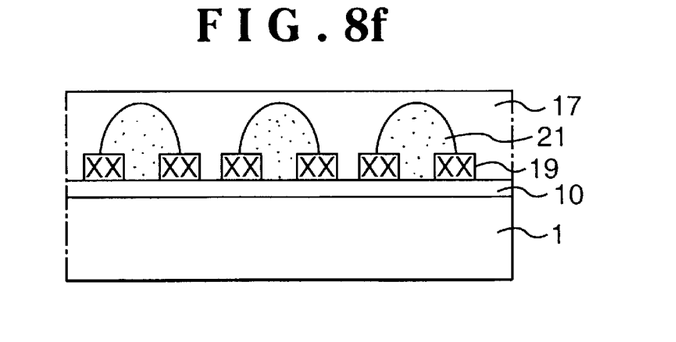
Figure 8G:
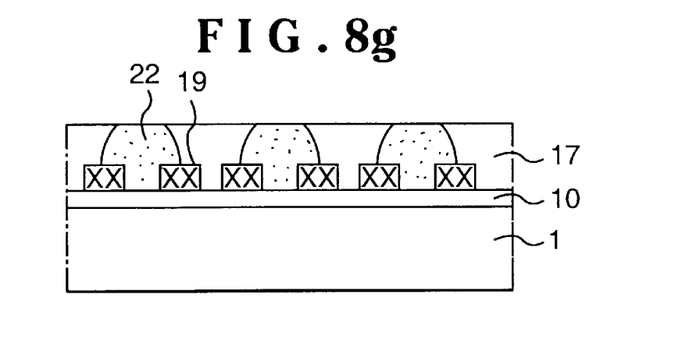

As shown in FIG. 8f, a second inorganic photoresist 17 is coated on the entire surface of the conductive transparent layer 10 including semispherical phase shifters 21 and, as shown in FIG. 8g, the second inorganic photoresist 17 is polished using a chemical mechanical polishing technique so that a surface or top portion of each of the semispherical phase shifters 21 is polished-off.

Figure 8H:
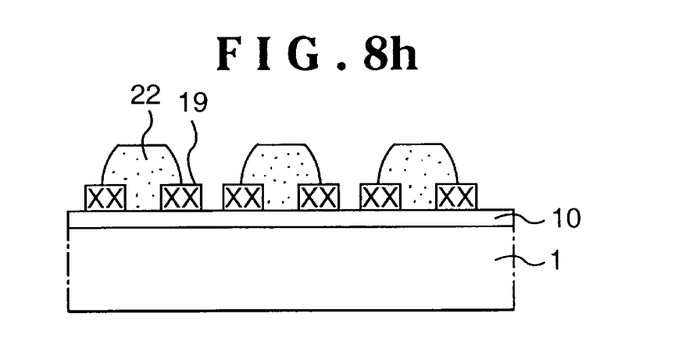

Next, as shown in FIG. 8h, remaining inorganic photoresist 17 is removed with an alkaline developer. Thus, phase shifters 22, each having a planar top and rounded sidewalls, can be obtained.

Figure 9:
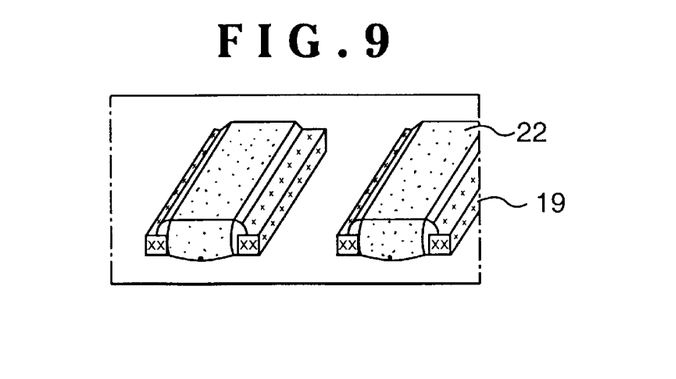
FIG. 9 illustrates a completed phase-shifting mask in accordance with the first embodiment of the present invention.

As shown in FIG. 9, which is a perspective view of the structure shown in FIG. 8h, the front and rear sidewalls of the phase shifter 22, which are not adjacent silver doped inorganic photoresist portions 19 (light shielding layer), also have a semispherical or rounded shape. As further shown in FIG. 9, light shielding layers 19 have a columnar shape and extend across a portion of substrate 1.

A method for forming a phase-shifting mask in accordance with a second embodiment of the present invention will now be described.

Figure 10A:
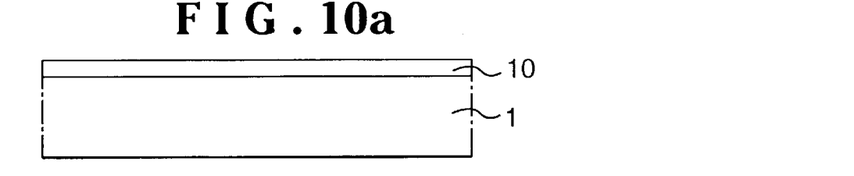
FIGS. 10a–10i illustrate sectional views showing a method for forming a phase-shifting mask in accordance with a second embodiment of the present invention.
Figure 10B:
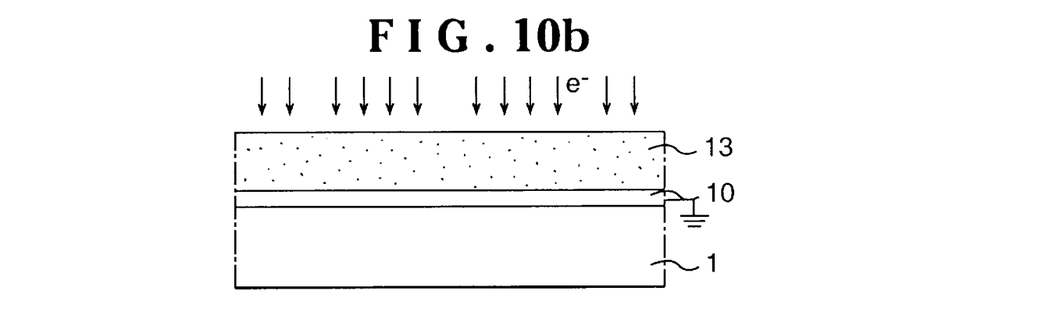
Figure 10C:
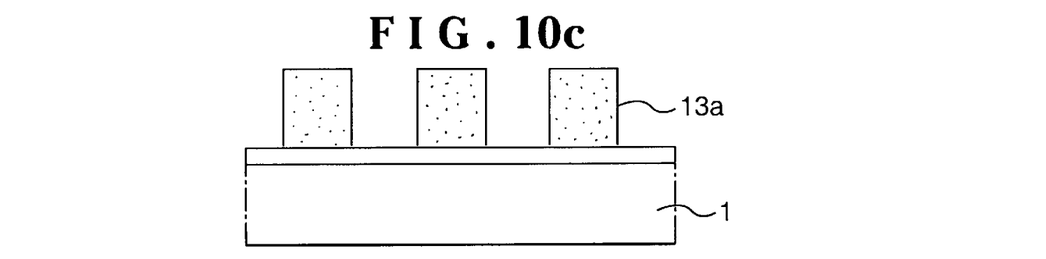
Figure 10D:
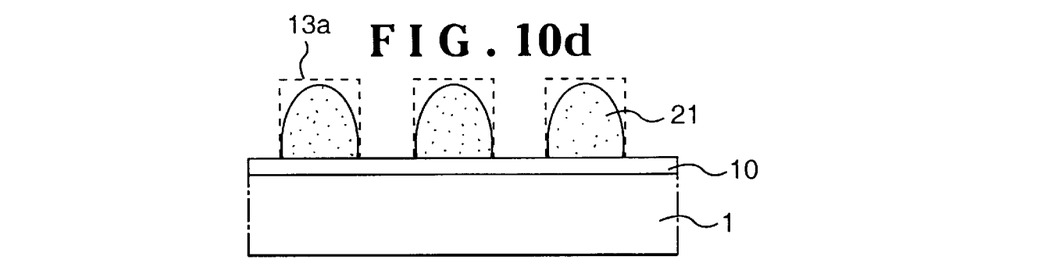
Figure 10E:
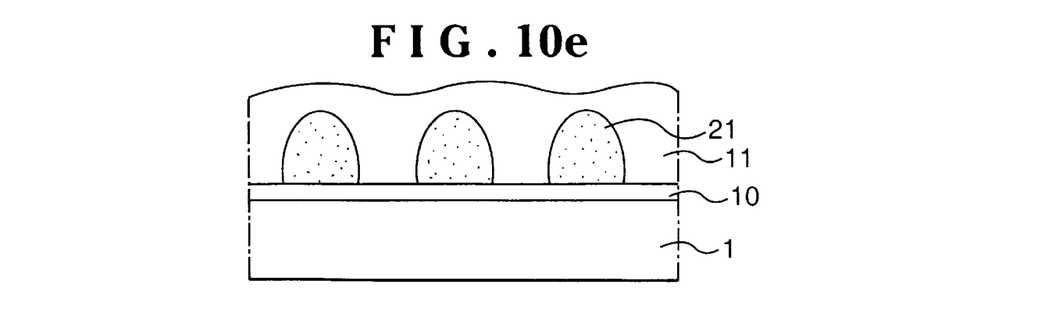
Figure 10F:
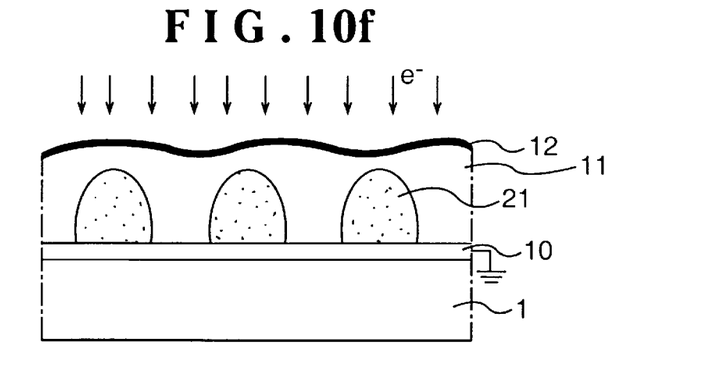
Figure 10G:
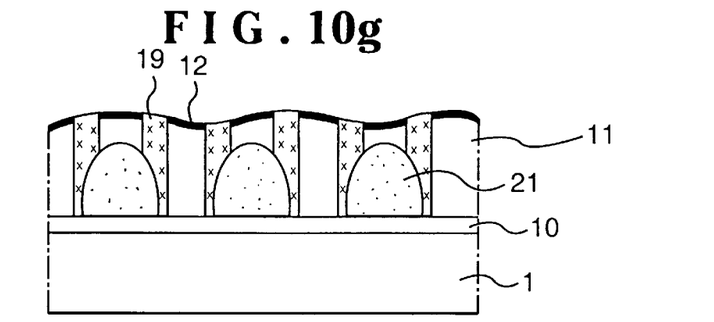
Figure 10H:
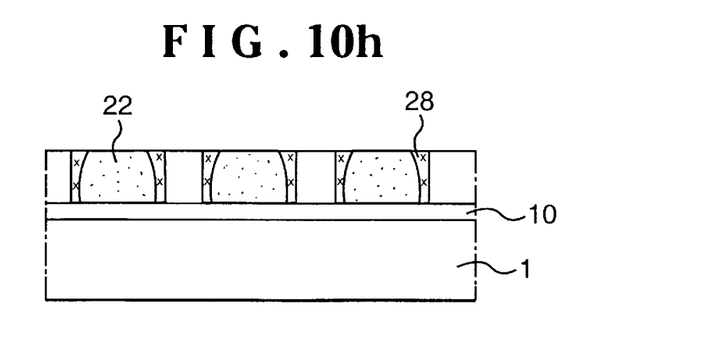
Figure 10I:
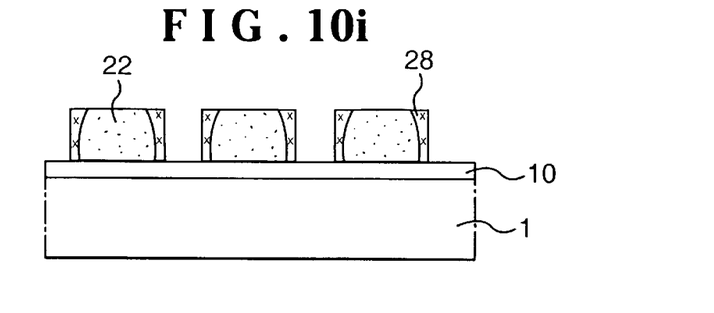
Figure 11:
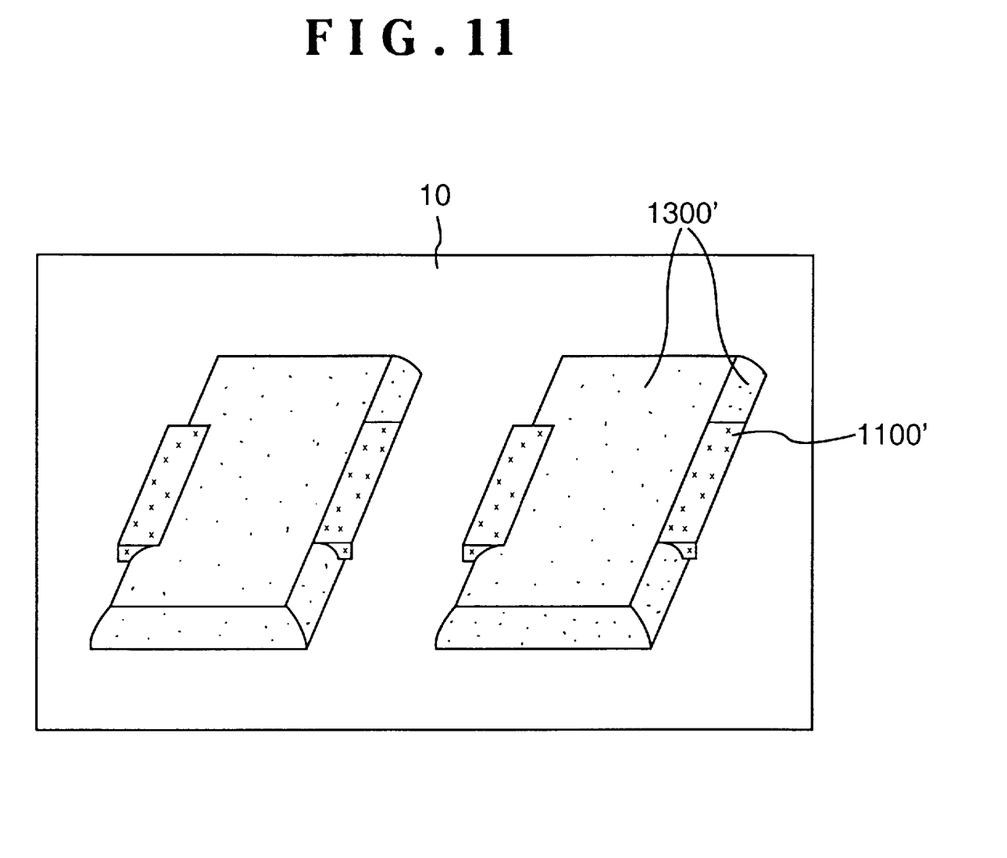
FIG. 11 illustrates a complete phase-shifting mask in accordance with the second embodiment of the present invention.

FIGS. 10a–10i illustrate sectional views showing the method for forming a phase-shifting mask in accordance with the second embodiment of the present invention, and FIG. 11 illustrates a perspective view of the completed phase-shifting mask in accordance with the second embodiment of the present invention. As will be discussed in greater detail below, the method for forming a phase-shifting mask in accordance with the second embodiment of the present invention forms light shielding layers on the sides of the phase shifters.

As shown in FIG. 10a, a conductive transparent layer 10 is first formed on a transparent substrate 1. Next, as shown in FIG. 10b, a photoresist layer 13 (preferably an organic photoresist, for example PMMA) for use in electron beam lithography is coated on the conductive transparent layer 10. Phase-shifting and transparent regions are also defined using an electron beam to selectively expose those portions corresponding to transparent regions of the mask.

As shown in FIG. 10c, substrate 1 is immersed in a developer solution to remove portions of photoresist 13 exposed by the electron beam. As a result, rectangular phase shifters 13a are provided at specified intervals.

As shown in FIG. 10d, rectangular phase shifters 13a are heated and melted into semispherical or rounded phase shifters 21. Preferably, the semispherical phase shifter 21 has the same sidewall angle as that of the first embodiment described above.

Next, as shown in FIG. 10e, a first inorganic photoresist 11 is coated to cover each surface of the semispherical phase shifters 21, and the conductive transparent layers 10, to a thickness such that the surface thereof is substantially flat.

As further shown in FIG. 10f, the resulting structure is dipped in a solution containing silver (preferably AgNO$_3$) to plate a silver-containing layer 12 on the surface of the first inorganic photoresist 11. Then, after grounding the conductive transparent layer 10, light shielding regions are defined by selectively exposing silver containing layer 12 to an electron beam.

Accordingly, as shown in FIG. 10g, silver in portions of the silver-containing layer 12 exposed by the electron beam diffuse into the first inorganic photoresist 11, thereby forming selected silver doped inorganic photoresist 19 in the first inorganic photoresist 11. During exposure, current generated by the electron beam is drained off to ground through the conductive transparent layer 10. The resulting silver doped inorganic photoresist 19 serves as a light shielding layer.

As shown in FIG. 10h, the silver-containing layer 12 is removed in aqua regia, HNO$_3$—HCl—H$_2$O, or an alkaline developer. Then, the first inorganic photoresist 11 and the silver doped inorganic photoresist 19 is flattened using CMP until a top portion of each of the semispherical phase shifter 21 surfaces is polished-off.

Next, as shown in FIG. 10i, remaining portions of first inorganic photoresist 11 between doped inorganic photoresist 19 is removed with an alkaline developer.

Thus, phase shifters 22 are formed having planar top surfaces and round sidewalls. In addition, light shielding layers 28 are provided at opposing sides of each of the phase shifters 22.

As shown in FIG. 11, light shielding layers are formed on rounded side portions of the phase shifters. However, those portions not formed adjacent the light shielding portions are also not rounded.

The operation and advantages of the phase-shifting mask of the present invention will be explained below.

Figure 12:
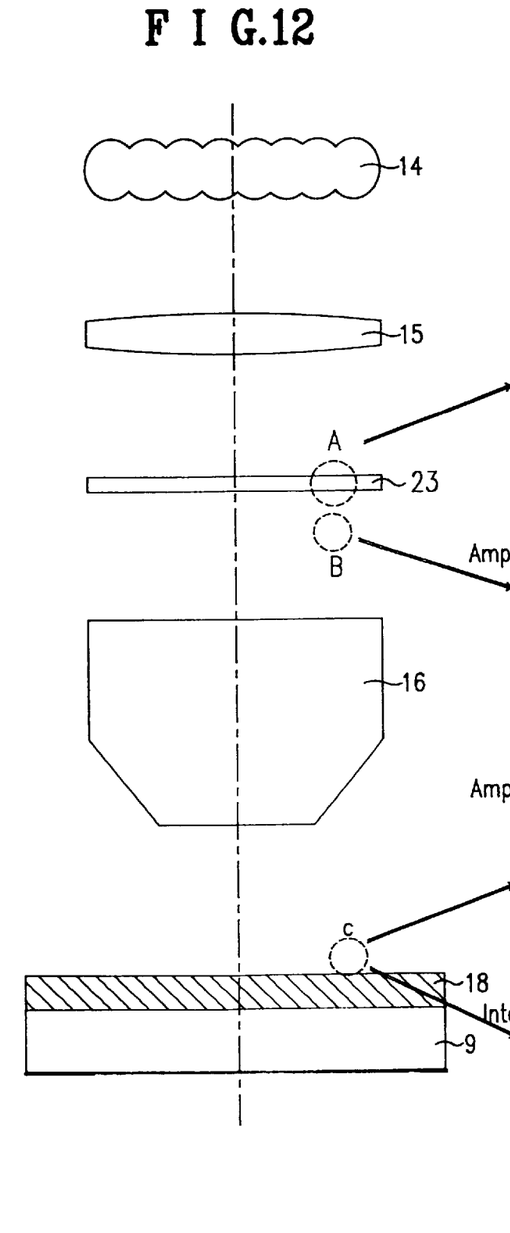
FIG. 12 illustrates a projection system for use in conjunction with the phase-shifting mask of the present invention.

FIG. 12 illustrates a projection system apparatus utilizing the phase-shifting mask of the present invention and, FIGS. 13a–13d illustrate the phase-shifting mask according to the present invention and amplitudes of light at different locations of the phase shifting mask when used in conjunction with the apparatus shown in FIG. 12.

As shown in FIG. 12, the projection system for use with the phase-shifting mask of the present invention includes a fly's eye lens 14 that transmits light to a condenser lens 15 where it is focused through phase shifting mask 23 of the present invention. Light next passes through reduction lens 16 to expose photoresist film 18 on a semiconductor substrate.

Figure 13A:
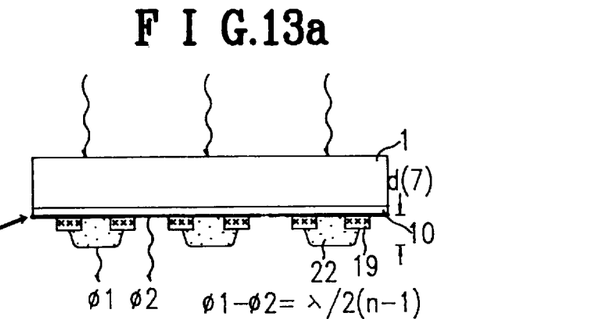
FIGS. 13a–13d illustrate a phase-shifting mask in accordance with the present invention and resulting amplitudes of light at different locations within the system shown in FIG. 12.
Figure 13B:
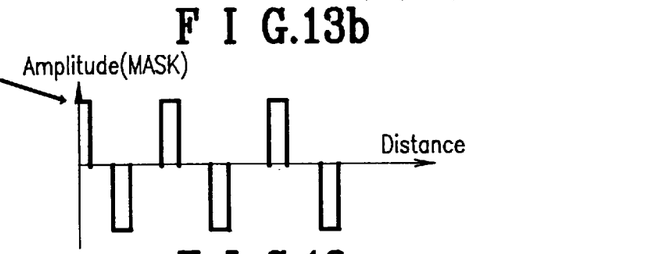
Figure 13C:
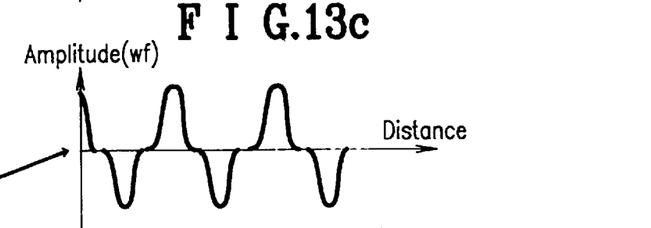
Figure 13D:
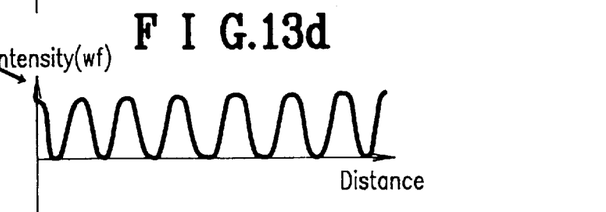

FIG. 13a illustrates an enlarged view of portion A of the phase-shifting mask 23 of the present invention and, FIGS. 13b and 13c illustrate the amplitudes of light transmitted through the phase-shifting mask at a plane located near the phase-shifting mask, and at the surface of wafer 9 (location B) FIG. 13d illustrates light intensity at the surface of wafer 9.

As shown in FIG. 13a, assuming a monochromatic light is incident to the phase-shifting mask of the present invention, the phase of the light passing through the mask is shifted according to which portion through which the light has passed.

That is, a phase of the light passing through a region composed of the transparent substrate 1 and the conductive transparent layer 10 is $\phi_1$, while a phase of the light passing through regions each composed of transparent substrate 1, the conductive transparent layer 10, and the phase shifter 22 is $\phi_2$.

In order to achieve the best resolution, the phase difference between light passing though substrate 1 and layer 10, and substrate 1, conductive layer 10 and phase shifter 22 should be 180°. Thus, thickness d of the phase shifter and the phase difference $\phi_1$–$\phi_2$ should have the following relation.

$$d = \phi_1 - \phi_2 = \frac{\lambda}{2(n-1)} =$$

(where, $\lambda$ represents a wavelength of a light from the light source, and n represents a refractive index.)

The resulting light intensity and amplitude of a phase-shifting mask in accordance with the present invention is shown in FIGS. 13b–d.

Figure 14:
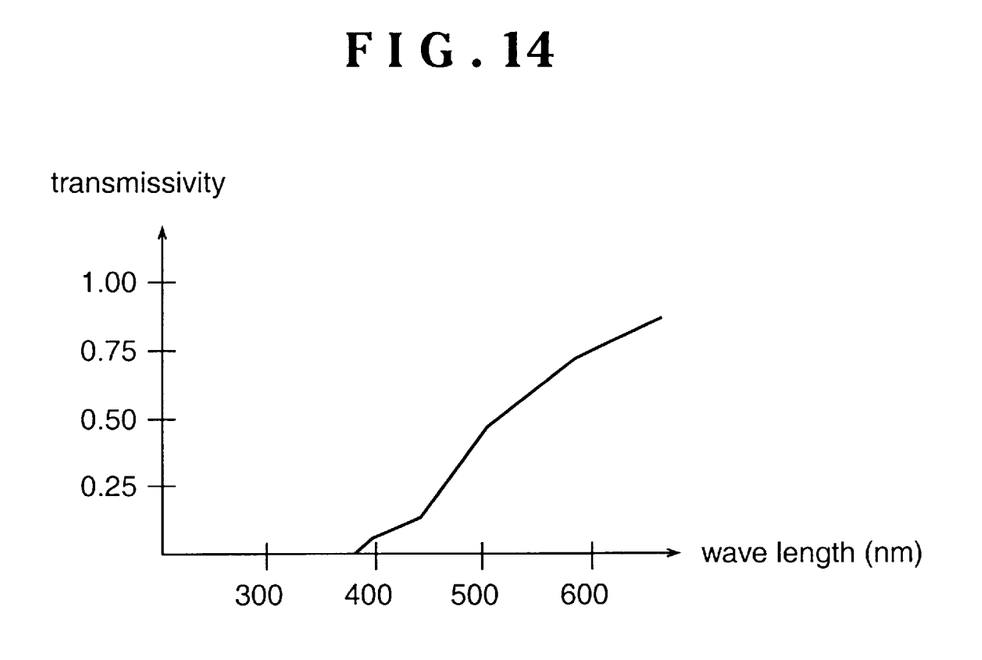
FIG. 14 illustrates a graph showing light transmissivity vs. wavelength of an inorganic photoresist in accordance with yet a further embodiment of the present invention.

It can be derived from FIG. 14, illustrating the relationship of transmissivity and exposure light wavelength, that the optical properties of the inorganic photoresist used as the light shielding layers in the present invention show improvement in light shielding effects as the wavelength decreases beyond the i-line (365 nm). Accordingly, in the present invention where a silver-doped inorganic photoresist is used as the light shielding layers, if an appropriate exposure wavelength is selected, a satisfactory light shielding effect can be obtained.

The phase-shifting mask of the present invention, as explained above, has the following advantages. First, since the light shielding layers are not formed by depositing and etching a metal, but by depositing an alkaline developing and inorganic photoresist, the surface of the light shielding layer is smooth.

Second, the silver-doped inorganic photoresist, which has an excellent etch selectivity relative to the undoped inorganic photoresist, facilitates formation of vertical light shielding sidewalls and simple patterning.

Third, formation of the phase shifters only of the organic photoresist and inorganic photoresist facilitates simple re-work of defective parts.

Fourth, the slope adjustment on the phase shifter in direct contact with the conductive transparent layer is preferably performed by heat treatment. Thus, the manufacturing process is simplified.

Fifth, an improved light shielding effect of the silver-doped inorganic photoresist is achieved as the wavelength becomes shorter below the i-line, and is favorable for manufacturing integrated circuits with high device packing densities.

Sixth, the drainage of electrons during exposure by the electron beam to ground through the conductive transparent layer of $SnO_2$ prevents charge-up.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the claims.

What is claimed is:

1. A phase-shifting mask comprising:

a transparent substrate;

a conductive transparent layer formed on the transparent substrate;

a plurality of light shielding layers formed at predetermined intervals on the conductive transparent layer; and a plurality of phase shifters formed between pairs of light shielding layers on the conductive transparent layer, each of said phase shifters being shaped to have a flat top and rounded sides.

2. The phase-shifting mask as claimed in claim 1, wherein the light shielding layer includes an impurity doped inorganic photoresist.

3. The phase-shifting mask as claimed in claim 2, wherein the impurity includes silver.

4. The phase-shifting mask as claimed in claim 1, wherein a transparent region is formed between adjacent phase shifters.

5. The phase-shifting mask as claimed in claim 4, wherein the transparent region transmits light with substantially no loss.

6. The phase-shifting mask as claimed in claim 1, wherein the conductive transparent layer includes $SnO_2$.

7. The phase-shifting mask as claimed in claim 1, wherein the phase shifter includes an inorganic photoresist.

8. A method for forming a phase-shifting mask comprising the steps of:

providing a substrate;

forming a conductive transparent layer on the substrate;

forming a plurality of light shielding layers in the conductive transparent layer, each of said plurality of light shielding layers being spaced from one another on said conductive transparent layer; and forming a plurality of phase shifters, each having a planar surface and a rounded side surface, each of said plurality of phase shifters provided between respective pairs of said plurality of light shielding layers.

9. A method in accordance with claim 8, wherein said plurality of light shielding layers are spaced at predetermined intervals.

10. A method in accordance with claim 8, wherein a space between said pairs of shielding layers is a phase shifting region.

11. The method as claim in claim 10, wherein the step of forming the phase shifters includes the steps of:

depositing an organic photoresist layer having a planar surface on the conductive transparent layer;

selectively patterning the organic photoresist layer to leave the organic photoresist only in the phase-shifting regions;

melting the patterned organic photoresist layer thereby rounding edges of said patterned organic photoresist;

forming a second inorganic photoresist layer on said substrate;

polishing the second inorganic photoresist layer and the patterned organic photoresist layer so that a top portion of the patterned organic photoresist layer is planarized; and selectively removing the second inorganic photoresist.

12. The method as claimed in claim 11, wherein an angle formed between a sidewall of said patterned organic photoresist layer and a surface of the substrate is in a range of 30° to 80°.

13. The method as claimed in claim 8, wherein the substrate is transparent.

14. The method as claimed in claim 8, wherein the conductive transparent layer includes $SnO_2$.

15. The method as claimed in claim 8, wherein the step of forming the light shielding layers includes the steps of:

forming a first inorganic photoresist layer on the conductive transparent layer;

forming an impurity containing layer on the first inorganic photoresist layer;

selectively directing an electron beam onto the impurity containing layer, thereby diffusing the impurities into the first inorganic photoresist layer to form an impurity doped inorganic photoresist region and an undoped first inorganic photoresist region; and selectively removing said undoped first inorganic photoresist.

16. The method as claimed in claim 15, wherein the conductive transparent layer is grounded, thereby draining a current generated during said step of selectively directing said electron beam.

17. The method as claimed in claim 15, wherein the inorganic photoresist includes $Ge_{10}Se_{90}$.

18. The method as claimed in claim 15, wherein the impurity includes silver.

19. The method as claimed in claim 15, wherein said undoped first inorganic photoresist region is removed with a solution including $HCl-HNO_3-H_2O$.

20. The method as claimed in claim 8, wherein the phase shifter includes an organic photoresist.

21. The method as claimed in claim 20, wherein the organic photoresist includes poly methyl metha acrylate having a thickness d, wherein d satisfies the formula $d=\lambda/2(n-1)$, where $\lambda$ represents a wavelength of a light from a light source, and n represents a refractive index.

22. A phase shifting mask comprising:

a transparent substrate;

a conductive transparent layer formed on said transparent substrate;

a plurality of phase shifters formed on the conductive transparent layer, each of said plurality of phase shifters having a substantially flat top surface and rounded side surfaces; and a plurality of light shielding layers, pairs of which provided on opposite sides of respective ones of said phase shifters.

23. The phase-shifting mask as claimed in claim 22, wherein said plurality of shifters includes an organic photoresist.

24. The phase-shifting mask as claimed in claim 22, wherein each of said plurality of light shielding layers have a substantially columnar shape.

25. The method as claimed in claim 24, wherein the phase shifter includes an organic photoresist.

26. The phase-shifting mask as claimed in claim 22, wherein the light shielding layers include an impurity doped inorganic photoresist.

27. A method for forming a phase-shifting mask comprising the steps of:

provi﻿ding a substrate;

forming a conductive transparent layer on the substrate;

forming a plurality of rounded phase shifters at fixed intervals on the conductive transparent layer;

forming a light shielding layer at respective sidewalls of each of said rounded phase shifters; and polishing the rounded phase shifters and the light shielding material to flatten a top portion of each of the rounded phase shifters, while leaving said light shielding layers at said sidewalls of each of the phase shifters.

28. The method as claimed in claim 27, wherein the substrate is transparent.

29. The method as claimed in claim 27, wherein the conductive transparent layer includes $SnO_2$.

30. The method as claimed in claim 27, wherein the step of forming a plurality of rounded phase shifters includes the steps of:

depositing an organic photoresist layer on the conductive transparent layer;

patterning the organic photoresist layer to leave the organic photoresist only in phase-shifting regions; and melting the patterned organic photoresist to form said rounded phase shifters.

31. The method as claimed in claim 27, wherein an angle formed between a sidewall of each said plurality of phase shifters and the substrate is in a range of 30° to 80°.

32. The method as claimed in claim 27, wherein said steps of forming said light shielding layer and polishing step includes the steps of:

depositing an inorganic photoresist layer on said substrate;

selectively doping impurities into the inorganic photoresist layer at side portions adjacent said phase shifters;

polishing the rounded phase shifters and the inorganic photoresist to thereby flatten a top portion of each of said rounded phase shifters; and selectively removing undoped portions of said inorganic photoresist layer.

33. The method as claimed in claim 32, wherein the inorganic photoresist includes $Ge_{10}Se_{90}$.

34. The method as claimed in claim 32, wherein the selectively doping step includes the steps of:

depositing an impurity containing layer on the inorganic photoresist layer;

selectively exposing opposing sides of each of said rounded phase shifters with an electron beam so that the impurities in the impurity containing layer is diffused into the inorganic photoresist; and removing the impurity containing layer.

35. The method as claimed in claim 27, wherein the impurity includes silver.

36. The method as claimed in claim 27, wherein said polishing step includes a chemical mechanical polishing step.

37. The method as claimed in claim 32, wherein the undoped portions of said inorganic photoresist layer are removed using $HCl-HNO_3-H_2O$.

* * * * *